US005698623A

United States Patent [19]
Jacobs

[11] Patent Number: 5,698,623
[45] Date of Patent: Dec. 16, 1997

[54] RESIN PRECURSORS HAVING THIXOTROPIC PROPERTIES AND FILLERS STABILIZED AGAINST SETTLING

[76] Inventor: Richard L. Jacobs, 1630 Fiske Pl., Oxnard, Calif. 93033

[21] Appl. No.: 662,325

[22] Filed: Jun. 12, 1996

Related U.S. Application Data

[63] Continuation-in-part of Ser. No. 529,942, Sep. 18, 1995, abandoned, which is a continuation-in-part of Ser. No. 234,328, Apr. 28, 1994, Pat. No. 5,451,629.

[51] Int. Cl.[6] .............................. C08J 5/10; C08K 3/08; C08L 75/00
[52] U.S. Cl. ..................... 524/440; 524/439; 524/507; 524/779; 252/514; 528/67
[58] Field of Search ..................... 524/779, 439, 524/440, 495, 496, 507; 252/514, 182.2, 182.21, 182.22, 182.27, 182.28; 528/59, 60, 65, 67, 76, 77

[56] References Cited

U.S. PATENT DOCUMENTS

| 4,518,524 | 5/1985 | Stoetzer ........................... 252/514 |
| 5,041,517 | 8/1991 | Vu et al. ........................... 528/60 |
| 5,395,876 | 3/1995 | Frentzel et al. ..................... 524/440 |

*Primary Examiner*—Vasu S. Jagannathan
*Assistant Examiner*—U. K. Rajguru
*Attorney, Agent, or Firm*—Louis J. Bachand

[57] ABSTRACT

Addition of a polyurethane or polyurea polymer to each part of a particulate filled precursor of a two-part resin stabilizes the filler against settling from suspension, and provides thixotropic response when the precursors are expressed from a container.

45 Claims, No Drawings

RESIN PRECURSORS HAVING THIXOTROPIC PROPERTIES AND FILLERS STABILIZED AGAINST SETTLING

REFERENCE TO RELATED APPLICATION

This application is a continuation in part of my application Ser. No. 08/529,942, filed Sep. 18, 1995, now abandoned, which in turn is a continuation in part of application Ser. No. 08/234,328, filed Apr. 28, 1994, now U.S. Pat. No. 5,451,629. The disclosures of these applications are incorporated herein by this reference.

FIELD OF THE INVENTION

This invention has to do with compositions useful in electronic assembly such as in circuit boards and like arrangements of various electrical components, including integrated circuit components, transistors, resistors, rectifiers, capacitors, quad flat packs and multichip modules having current of magnetic flux carrying, storing or modifying capability, and conductive paths and wiring therebetween, supported in a predetermined configuration for performance of electronic, electrical and other physical functions, which assemblies when partially or completely electrically interconnected by means of the invention compositions are hereinafter sometimes referred to as electronic structures. More particularly, the invention relates to electrically conductive compositions which are free of tin and lead and other toxic elements, and which can substitute therefor in many interconnection applications where high conductivity is required.

In a particular aspect, the invention provides a substitute for conventional lead/tin solders in highly demanding applications such as circuit board manufacture, by affording ease of precise application volume and location, high speeds of set-up to a permanent interconnection of the electrical components, and a commercially useful shelf-life.

In another aspect, the invention is concerned with A-side or first side, and B-side or second side, type resins, i.e. two component resins, and resins formed from first and second precursors which are mixed and reacted to form the resin. Such resin precursors when filled with conductive, or superconductive, high specific gravity fillers such as metal, ceramics and conductive minerals, e.g. specific gravities above 1.0. tend to become nonuniform in composition owing to the effects of gravity on the fillers. The fillers, although originally suspended, tend to settle. When the two precursors are expressed from a container for mixing and reaction, the results are irregular as the compositions change in uniformity of composition over time with too much or too little filler being expressed as the delivery of the resin precursors progresses.

The present invention stabilizes the suspension of high specific gravity fillers in the precursors of two component resins, such as urethanes, phenolics, epoxies, acrylic or acrylate, polyester and other fillable, two-component resins. These resins are generally considered thermosetting in the sense that they are irreversibly reacted when their precursors are combined.

Advantageously, the present stabilized compositions are thixotropic as well, as the stabilizing polymers to be described appear to support the fillers by hydrogen bonding and this bonding is readily overcome under flow pressure, making the precursors stably filled and readily expressible even from restrictive nozzles, as in the case of dual piston/chamber delivery systems. This facility in expression is to be sharply contrasted with low specific gravity, mineral suspension aid materials such as fumed silica. While these suspension aids may effect adequate suspension of the fillers systems their thickening of the compositions renders the compositions all but unexpressible except under undue pressure and may even require hydraulic force. The present invention greatly enhances the opportunities to use conductive fillers-resin combinations to form solder joints, and other conductive connections, by providing compositions and their precursors which are highly conductive, readily adherent to a variety of conductive and non-conductive materials, reactive upon application in situ, and in short and very short time periods, e.g. 30 seconds to 3 minutes, to be usable for replacement of solder welds in many electronic structure applications, such as circuit boards.

BACKGROUND

The securement of permanent conductive contact between electrical components without the use of toxic elements is a high priority in circuit board manufacture and other electronic structure assembly operations. Requirements of a successful material for such applications include high conductivity, rapid adhesion where applied, achievement of a stable physical state in moments, and consistent results every time used.

SUMMARY OF THE INVENTION

Urethane polymers filled with conductive particles such as finely divided copper, aluminum and silver, superconductors, or carbon, have been found to provide a conductive composition which is adherent to metal and to other substrates including epoxy-impregnated glass fiber circuit boards. In the most demanding applications, silver is the filler of choice, at loading of from 60 to 92 per cent by weight, and preferably from 70 to 80 per cent by weight, but other metals such as aluminum and copper, carbon, and minerals such as conductive ceramics, including superconductive ceramics can be used in particular circumstances. In addition to good conductivity and adhesion, a sufficiently quick acting resin to permit apply-and-hold application of the conductive composition is required and for this purpose the invention uses certain resins which have the requisite physical properties.

Not all polymers, however, are satisfactory, since the presence of high loadings of metal, particularly silver, may induce premature reaction of one side or the other of the precursor compositions, particularly urethane polymer precursors, limiting shelf life, i.e. shelf-stability, and thus the practical utility of the conductive composition.

It is an object of the invention therefore to provide conductive filled resin precursors which are stable in suspension of the fillers and thixotropic when subjected to flow pressure. Other objects of the invention to become apparent hereinafter are realized in accordance with the invention in a resin precursor composition containing in suspension a filler normally tending to settle over time, the composition comprising a liquid first resin precursor reactive with a separately prepared second resin precursor to form a resin, and suspended within the first resin precursor from 5 to 500 parts by weight of a particulate filler per 100 parts by weight of the first resin precursor, and a sufficient amount from 0.5 to 25 parts by weight of polyurethane or polyurea polymer suspension aid per 100 parts by weight of the first resin precursor intimately distributed through the composition against settling of the filler from suspension, the suspension aid within the composition having thixotropic response to flow under pressure to permit ready dispensing of the composition with the filler suspended therein.

In this and like embodiments, typically: the polymer suspension aid is formed in situ in the resin precursor; the filler is an inorganic filler; the polymer suspension aid is polyurethane polymer; the polymer suspension aid is polyurea polymer; the filler is silver and is present in at least one of the first or second resin precursors in an amount from 60 to 92 parts by weight of silver per 100 parts of the first or second resin precursors; the polymer suspension aid is a polyurethane polymer and is present in one or both of the resin precursors in an amount from 1 to 10 parts by weight per 100 parts of the resin precursor; the polymer suspension aid is a polyurea polymer and is present in one or both of the resin precursors in an mount from 1 to 10 parts by weight per 100 parts of the resin precursor; the first and second resin precursors each comprise an epoxy resin precursor; the first and second resin precursors each comprise a urethane polymer precursor; the first and second resin precursors each comprise a phenol resin precursor; the first and second resin precursors each comprise a polyester precursor; the resin precursor comprises an acrylic or acrylate resin precursor; or, the resin precursor comprises a silicone resin precursor.

In a further embodiment of the invention there is provided a urethane resin precursor composition containing a suspended particulate filler normally tending to settle from suspension over time, the composition comprising a liquid first urethane resin precursor reactive with a separately prepared second urethane resin precursor to form a urethane resin, the first urethane resin precursor containing from 5 to 500 parts by weight of the particulate filler per 100 parts by weight of the urethane resin precursor, and further containing a sufficient amount of polyurethane or polyurea polymer suspension aid separate from and within the resin precursor to stabilize the suspension of the filler in the composition against settling, the polymer suspension aid having thixotropic response to flow under pressure to permit ready dispensing of the composition while the filler is maintained suspended therein.

In this and like embodiments, typically: the first urethane resin precursor comprises an isocyanato reagent; the isocyanato reagent is a first isocyanato reagent, and the polymer suspension aid comprises a polyurethane polymer reaction product of a liquid, saturated, nonbranched, aliphatic diol having an even number of carbon atoms and terminal hydroxyl groups and a second isocyanato reagent, the diol reacting rapidly with the second isocyanato reagent to the exclusion substantially of diol reaction with the first isocyanato reagent, whereby the flier suspension stabilizing polyurethane polymer suspension aid is formed in situ within the first urethane resin precursor comprising the isocyanato reagent; the polyurethane polymer suspension aid reaction product is reacted substantially free of reaction of the resin precursor isocyanato reagent with the diol, the polyurethane polymer suspension aid being present in an amount from 0.5 to 25 parts by weight per 100 parts by weight of the first isocyanato reagent urethane resin precursor; the polyurethane polymer suspension aid product reaction is substantially free of polymer chain terminating reactions; the diol comprises ethylene glycol, 1,4-butane diol or 1,6-hexane diol; the diol is added incrementally to the second polymer isocyanato reagent in the presence of the first isocyanato reagent to form the polyurethane polymer suspension aid in situ by preferential reaction with the second isocyanato reagent in the presence of the first isocyanato reagent and substantially free of reaction therewith; the particulate filler comprises a metal or mineral material; the particulate filler is a high specific gravity mineral material which does not impart thixotropic properties to the resin precursor; the particulate filler is an electrically conductive or superconductive metal or ceramic material; the particulate filler comprises silver, copper, or aluminum metal; the particulate filler is silver metal; and/or the particulate filler comprises conductive ceramic material.

In a further embodiment, there is provided a urethane resin precursor composition containing a suspended particulate filler normally tending to settle from suspension over time, the composition comprising reactive with a liquid first urethane resin precursor a separately prepared second urethane resin precursor to form a urethane resin, the second urethane resin precursor containing from 5 to 500 parts by weight of the particulate flier per 100 parts by weight of the second urethane resin precursor, and further containing a sufficient mount of polyurethane or polyurea polymer suspension aid separate from and within the resin precursor to stabilize the suspension of the filler in the composition against settling, the polymer suspension aid having thixotropic response to flow under pressure to permit ready dispensing of the composition while the filler is maintained suspended therein.

In this and like embodiments; typically, the polymer suspension aid comprises a polyurea polymer; the second urethane resin precursor comprises an active hydrogen containing reagent reactive with the first urethane resin precursor to form a resin comprised of repeating urethane linkages; the active hydrogen containing reagent comprises a polyol reagent, the first urethane resin precursor comprises a first isocyanato reagent reactive with the polyol reagent to form a resin comprised of repeating urethane linkages; the polyurea polymer suspension aid comprises the polyurea reaction product formed in situ in the second resin precursor of a polyurea-forming isocyanato reagent and an aromatic amine; and/or the aromatic amine is delayed not less than 10 seconds in its polyurea-forming reaction after mixing with the polyurea-forming isocyanato reagent.

In a still further embodiment, there is provided a urethane resin composition containing a mixture of a suspended particulate filler normally tending to settle from suspension over time, a liquid first urethane resin precursor and separately maintained therefrom a liquid second urethane resin precursor reactive with the first urethane resin precursor to form a urethane resin, the first and second urethane resin precursors containing from 5 to 500 parts by weight of the particulate filler per 100 parts by weight of the urethane resin precursor, the first urethane resin precursor further containing a sufficient amount between 0.5 and 25 parts per 100 parts by weight of the first urethane resin precursor of polyurethane polymer suspension aid separately formed within the first urethane resin precursor to stabilize the suspension of the filler in the first urethane resin precursor against settling, the second urethane resin precursor further containing a sufficient amount between 0.5 and 25 parts per 100 parts by weight of the second urethane resin precursor of polyurea polymer suspension aid separately formed within the second urethane resin precursor to stabilize the suspension of the filler in the second urethane resin precursor against settling, each of the polymer suspension aids having thixotropic response to flow under pressure to permit ready dispensing of their the precursors while the filler is maintained suspended therein.

The invention further provides a urethane resin reaction product the first and second urethane resin precursors with each other.

In this and like embodiments, typically: the suspension aid polymer in the first urethane resin precursor comprises a polyurethane polymer reaction product of a suspension aid polymer isocyanato reagent and a suspension aid polymer liquid, saturated, nonbranched, aliphatic diol having an even number of carbon atoms and terminal hydroxyl groups and a second isocyanato reagent, the reagents having a preferential reactivity with each other to form the suspension aid polymer rather than other resin products; the suspension aid polymer in the second urethane polymer comprises a polyurea polymer reaction product of a suspension aid polymer isocyanato reagent and a suspension aid polymer aromatic amine, the reagents having a preferential reactivity with each other to form the suspension aid polymer rather than other resin products; the suspension aid polymer in the first urethane resin precursor comprises a polyurethane polymer reaction product of a suspension aid polymer isocyanato reagent and a suspension aid polymer diol which is liquid, saturated, nonbranched and aliphatic, and has an even number of carbon atoms and terminal hydroxyl groups and a second isocyanato reagent, the reagents having a preferential reactivity with each other to form the suspension aid polymer rather than other resin products; the first urethane resin precursor comprises an isocyanato reagent and the second urethane resin precursor comprises an active hydrogen containing reagent reactive with the urethane resin precursor isocyanato reagent to form a resin comprised of repeating urethane linkages; the diol comprises ethylene glycol, 1,4-butane diol or 1,6-hexane diol; the particulate filler comprises a metal or mineral material; the particulate filler is silver, copper, or aluminum metal; the particulate filler is silver metal; and/or the particulate filler comprises ceramic material.

The invention further contemplates the method of stabilizing particulate filler against settling from suspension in a resin precursor while having thixotropic response in the precursor upon expression from a container, including maintaining a polyurethane or polyurea polymer in a small but effective amount in the precursors.

DETAILED DESCRIPTION

It has been discovered that fast bonding, shelf-stable conductive compositions that are useful to replace conventional solder in electronic assembly are realized by using a two-component resin, particularly an aliphatic urethane polymer filled with a high loading of conductive particulates, i.e. particles or flake, e.g. of silver, particularly silver flake, at loadings of from 62 to 90 per cent by weight, preferably from 70 to 80 per cent by weight, based on the total weight of the composition.

Aliphatic diisocyanates, rather than the more common aromatic diisocyanates, are useful in providing the appropriate reaction time, from 30 seconds to 3 minutes after application, and more importantly, having minimum reaction in the unapplied or stored state, so that the product has a practical shelf life enabling shelf storage for many months before use. The fast reaction time is essential to automated application of the conductive compositions, e.g. in circuit board manufacture.

The present conductive compositions lend themselves to application by means of dual cartridge dispensers, e.g. those described in my U.S. Pat. No. 4,869,400 wherein a first side reagent by expressing the two sides separately from side-by-side cartridges into a common manifold, through a mix tip (a complexly baffled tube) and thence out onto the situs of application, e.g. the connection of electronic components leads to wiring or other leads. Other modes of application can be used.

The invention composition first side is an isocyanato reagent and comprises an aliphatic diisocyante, described above, and preferably a hydrophobic organic polyfunctional active hydrogen moiety such as those listed above in the relative amounts indicated. The first side precursor further includes the loading of conductive metal, copper, silver or aluminum. Gold or carbon may be used. In accordance with the present invention a stabilizer is added to the first side precursor comprising a polymer, preferably a polyurethane or polyurea polymer. The stabilizing polymer is formed in situ in the first side precursor from polymer forming components which do not interfere with the readiness of the first precursor to react with a second side precursor. Accordingly, a polyurethane polymer formed from a rapidly reacting diol and a isocyanato reagent will form a filler suspension stabilizing polyurethane polymer in situ without affecting the reactability of the first side in subsequent reaction with a second side. And, a polyurea polymer formed in situ in the resin second side from reagents which preferentially initially and completely react with each other rather than with the polyol or other active hydrogen containing reagents of a urethane resin will form a filler suspension stabilizing polyurea polymer in situ without affecting the reactability of the second side precursor. The composition of these typical polymers is shown in the Examples.

In the case of urethane resins the invention first side comprise an isocyanato reagent, such as methylene dicyclohexane diisocyanate. The invention composition second side is a polyol reagent having an active hydrogen reactive with the isocyanato reagent. While this reagent may be any of the previously known polyols reactive with isocyanate, e.g. those enumerated in my earlier U.S. Pat. Nos. 4,689,400 and 5,252,697, whose disclosures are incorporated by this reference, provided speed of reaction, strength of bond and shelf stability are retained adequate to the electronic component bonding application described herein.

The invention is illustrated by the following Examples in which all parts and percentages are by weight.

EXAMPLE 1

Except as changed below the preparation of the resin precursors was in accordance with the Example in my issued U.S. Pat. No. 5,451,629. A urethane resin first precursor was prepared by mixing 24 parts of an aliphatic diisocyanate, methylene dicyclohexane diisocyanate (Desmodur W), with 4 parts of castor oil (D.B. Oil ex Caschem) in a suitable reactor under vacuum with slow agitation at 300 degrees F. and the mixture reacted for 1 hour. A second, aromatic diisocyanate (Mondur CD), 6 parts, was added. 1,4-butane diol, 1.8 parts, was then added dropwise. The diol reacted preferentially with the aromatic diisocyanate owing to the much faster rate of reaction between the diol and the aromatic diisocyanate. Silver flake, 75 parts, was folded in to suspend the silver in the precursor. Observation of this composition in storage in a dispenser cartridge for over 6 months indicated no settling of the silver or adverse effect on reactivity to a uniform polyurethane resin.

A urethane polymer second precursor was prepared by combining castor oil (D.B; Oil, ex Caschem), 14 parts, with 3,5-diethyl-toluene diamine, 1.6 parts, and N'N'N'N'-tetrakis (2-hydroxy or propyl)ethylenediamine (Quadrol ex BASF Wyandotte), 9 parts, by simple blending at room temperature. The aromatic isocyanate of the first side was added to the second side, dropwise, under high agitation. A paste formed. An aromatic amine, diethyltoluene diamine, was added to at room temperature, and the mixture was heated at 240 degrees F. until a polyurea polymer was preferentially formed by the reaction of the aromatic diisocyanate and the aromatic amine reaction to the exclusion of other reactions. This reaction commences only after 10 to 30 seconds after mixing of the reagents which is advantageous to ensure easy mixing and blending of the reagents. The reaction of the other reagents present with the polyurea reagents is slower than the polyurea reaction just described so the polyurea reaction is substantially complete before these secondary reaction can begin, and at that point the polymer reactive reagents are consumed. As a result of this sequencing of reactions, there is substantially no reaction of these polymer reagents with the urethane second side reagents. Flaked silver (Silflake 135) was added and folded in for 30 minutes. When mixture was thoroughly mixed, organo-metallic catalyst, bismuth napthenate (Coscat 83), 0.5 part, was added; mixing was continued for a further 30 minutes. The resulting second precursor material was put up in dispenser cartridges. After more than 6 months of storage the composition showed no evidence of settling of the filler, and no adverse effect on reactivity of the second precursor with the first.

The first and second side dispenser cartridges are mounted to a dual dispenser having a common manifold and a mix tip. A circuit board blank with a pair of integrated circuits mounted thereto and a conductive line between them are electrically coupled by dispensing the cartridge contents in equal volumes jointly, mixed by the mix tip, onto the IC leads juxtaposed with the conductive line. The resin precursors became quite fluid when expressed from the cartridges indicating a thixotropic effect, i.e. the standing precursor composition was thick and suspended the silver in place without settling. Immediately upon dispensing, the precursors were fluid-like and easy to express, and in emerging from the mix tip flowed easily onto the bond situs defined by the junction of the conductive line and the IC lead. The dispensed resin, however, quickly stops flowing and stays on the situs. In three minutes the resin cures so as to be unyielding, and it firmly bonds the conductive line and IC lead together. An increase in catalyst, e.g. to 2 parts, will reduce the cure time to 30 seconds. Conductivity of the bond is confirmed by passing a current between the conductive line and the IC. Typical conductivity values are above 3 mhos.

EXAMPLES 2-6

First and second side precursors of epoxy, acrylic, acrylate, polyester and phenol resins are modified by addition of the polyurethane and polyurea resins prepared in Example 1 and by the addition of like amounts of silver to Example 1. The precursors maintain the suspension of the silver and are reactive to their respective resin precursors.

EXAMPLE 7

Example 1 is duplicated using a superconductor powder as a conductive filler. The superconductor powder can be any powder or material which has or can be treated to give superconductivity properties. For example, ceramic type superconductors and metallic superconductors can be used, including those ceramic superconductors of the Y-Ba-Cu-O type, the Bismuth Group or the Thallium Group, and others including those mentioned in U.S. Pat. No. 5,504,138.

With respect to superconducting systems of the invention, with the paper provided by Podkletnov an Nieminen, there is evidence that there is some interaction between the field of gravity and superconductors. There is already a picture of what the superconductor is and some ideas of how it folds fermions into bosons and vice-versa. Some physicists assume that fermions can only be folded into bosons through a gravitational field. Assuming the supermolecule described in my patent U.S. Pat. No. 5,504,138, I have disclosed the only construct of a machine which will fold fermions into bosons. Combining that supermolecule construct and my theories of flux quantized anyons and braided waves, the example of the force field of light can be taken advantage of to create a working model of how gravity interacts with the superconductor and devise an intelligent experiment which will improve on its shielding effect.

Symmetries. All of the modern theories of our universe rely on real space-time being derived from some more fundamental universe. The Grand Unification Theory, Supersymmetry, String Theory and Twistor Theory all describe the formation of our universe from some higher (more fundamental) universe by the breaking of symmetries. It is not known exactly which symmetries are broken, nor in which order they were broken. But physicists are in agreement that certain spaces can be folded back into other spaces through fundamental force fields. One of these force fields is light and another is gravity.

Twistor Space. This is one paradigm of a universe more fundamental than our perceived space-time universe. It provides some concepts which are useful to ascertain the effects of a gravity field on matter. Twistor space has as its most fundamental construct the neutral plane, that plane through which all negative twistor chirality space is folded into positive chirality twistor space to create real space-time. This is a conceptual starting point, and its strength is the mathematics it uses to accurately predict the forces in the universe.

The neutral plane of twistor space is composed only of light (photons). A limitation of twistor neutral space is that photons cannot interact with one another without creating a real space-time consequence. For example, the creation of a particle is a possible real space-time interaction of a photon with another photon of neutral space.

The key concept here is that twistor neutral space is the force field (visualize a mirror) through which a local symmetry of electromagnetic energy is transformed into electromagnetic energy of some higher energy state. One real space-time consequence could be the interaction of a photon with a hydrogen atom in its ground state to produce an excited state, e.g. the fundamental of the next quantum level. Only a specific photon (having a certain wavelength or energy) can be absorbed to create this specific excitation. The energy of this photon must be equal to the energy absorbed in the transformation.

Mathematics of Twistor Space. The mathematics of twistor space is the same mathematics used to create the picture of the probability of an electron it its simplest form: the hydrogen atom. One must use basic physical assumptions about the position or momentum of an electron to create the eigenfunction. The form of the eigenfunction is a complex function and its complex conjugate is created the time-dependent or time-independent picture of the probably of an electron in 3-dimensional space.

Twistor theory uses the same powerful mathematics of complex conjugates to create a picture of real space-time out of negative chirality twistor space and positive chirality twistor space.

Gravity. The effects of gravity are known, but not exactly what it is. Gravity can be measured through the fundamental law which shows the acceleration is related to the product of masses and inversely to the distance between these masses.

Is gravity a force like magnetism? In some respects yes. It follows the same mathematical relationship, but its force is much weaker than electromagnetism. It is quantized? Probably yes. Is it bent by the concentration of mass and energy? Einstein said yes. Is it affected by relativity? Yes, Einstein shows that gravity bends light in 4-dimensional space-time, and the fundamental laws are the same for the universe, only the perception of the observer changes. Does gravity have duality like light? Constructs based on particles (gravitons) and waves both explain the forces of the universe very well. So there is duality as there is with light. In twistor space, gravity has a flat and a curved component. Gravity is asymmetric in twistor space, as is light. (Light is also asymmetric in real space-time.) Gravity might also be asymmetric in real space-time.

Until now, the concepts of gravity have not provided any handle to grab onto or utilize it. With the superconductor supermolecule construct, it may be possible to use the interconversion of fermions and bosons to interact with the gravitational field!

The Gravity Spectrum as the Force Field. It is expectable that gravity will be composed of range of energies and frequencies like the electromagnetic spectrum. When it comes to the interaction with matter, only certain light frequencies interact. For example, light in the visible and ultraviolet region interacts with the electrons of atoms to produce higher energy states. Light in the infra-red region interacts with molecules to create molecular vibrations and rotations. Is it not a good first assumption to predict that only gravity waves from a portion of a gravity energy spectrum produce interactions with certain masses? Is it possible that only certain frequencies interact with the fermions of the superconductor to produce higher energy level bosons and vice versa? Is it possible that the gravitons (gravitational quanta) have their first interaction with the electrons of the anyon planes?

Is it possible that a fermion in the braid can be converted to a boson through a fold (interaction) with a gravity wave component normal to the superconductor? If gravity waves have a parallel to light waves, then we can expect that the superconductor folds a boson across the gravity wave to produce a fermion, absorbing a gravity wave much like an electron absorbs a photon of light and finally emits a higher energy gravity wave in the process. The difference in energy supplied to the superconductor by an external source (like an electric or magnetic field) must be transiently increasing the energy state of the superconductor. But the superconductor must fall to a lower energy state again as it passes the energy on as a high energy gravity wave. The net energy in and out of the superconductor system is that energy supplied to shielding.

Interaction of the Superconductor, Magnetic Fields and Gravity. The spin rate of the superconductor appears to have some effect on shielding. At 50 Hz only a 0.05% weight loss was experienced. Then at some higher frequency (1 million Hz) a 0.3% weight loss was experienced in the sample. There were stable and unstable shielding regions with variations in radio frequency. One might expect stable and unstable regions of angular momenta with classical dynamics, but stable and unstable regions of shielding is not as easily explained.

If the superconductor were totally diamagnetic with no magnetic permeability, the radio frequency should have no effect at all on the disk. All superconductors have magnetic permeability which, in turn, allow currents to be induced in the skin of the superconductor. It has been said that the rotation of the superconducting body moves the grains and grain boundaries in the field, causing various disturbances of the magnetic fields because of the hysteresis effect. This explanation is consistent with anyon conversion into bosons. In fact, a construction of ground-up particles of YBaCuO might be used in a polymer matrix as a means of introducing many more Josephson junctions. Perhaps even the elasticity of the urethane might allow reduced hysteresis by allowing the physical grains to become anisotropic by allowing the physical grains to orient under stress. In this view, the eddy currents might operate over larger regions.

In one test, the superconducting disk actually rotated. For the disk to actually rotate, it just have attained a net current which is continually reversibly polarized at the rate at which the magnetic field alternates.

This behavior is consistent with the concept of the conversion fermions into boson. Describing the superconducting process in a steady state field (where the superconductor exhibits only the Meissner effect and no external voltage or magnetic field is impressed), there should be only one net conversion of a fermion into a boson for each electron pair. This should occur only as the superconductor is lowered in temperature below its critical temperature. As the fermion enters the conductor region, it is converted to a boson as it crosses the first anyon plane. It can be visualized as either being consistently net bosonic as the braided waves cross the anyon planes. The final exit of an electron pair from the conductor region is the transient formation of a fermions, but then the final inhalation of fermions occurs by a looping process to create bosons again. In other words, in a steady-state condition, the superconducting process is virtually all bosonic.

But under an impressed alternating magnetic field or alternating magnetic current, bosons might be broken back down again to fermions at a substantially higher rate. (This would be the step where energy is provided to the superconductor by the external magnetic field or current). But, the regions of the superconductor should go back to its bosonic state again in a stabilizing process. Energy in the superconductor system must be converted into gravity waves of higher energy to create shielding. The difference in energy in and out of the field should be the net shielding energy. The process is mediated only by the conversion of fermions into bosons and vice-versa across the gravitational field.

There is a general relationship between the rate of change of the magnetic field and the shielding provided by the superconductor. This does not describe the change in the rate of rotation of the disks as being linear with the change in frequency of the alternating current in the magnet. If gravity is a wave of a particular frequency, then just spinning a superconducting disk in the gravitational field should have the effect of exposing more bosons to the gravity wave than a non-spinning disk. An analogy would be a car's windshield catching more raindrops as the car moves faster. Therefore, it would expected that the non-linear response of shielding to rate of rotation demonstrates that gravity waves are not homogeneous (not homogeneous in distribution and not homogeneous in wavelength).

Also, shielding is maximized at certain frequencies. If gravity is composed of a spectrum of gravitational energy much like the electromagnetic spectrum, then there should be optimum regions of shielding at certain frequencies and there should be optimum regions for the conversion of bosons to fermions.

An alternating current might be more effective than a magnetic field in creating an energy conversion between the surroundings and the superconductor. By alternating the current at various frequencies across a polymer superconductor, an improved effect on shielding might be achieved. First, an alternating current should polarize the superconductor more easily than alternating magnetic flux. Second, the polymer superconductor will absorb and release energy to the gravitational field more effectively than the bulk (highly condensed ceramic) superconductor—both because of the elastomeric quality of the urethane matrix and also because of the infinitely more Josephson junction boundaries within the insulated superconducting grains of the urethane matrix.

The foregoing objects of providing highly stable suspensions of fillers in resin precursors and thixotropic effects upon expression of these precursors into reactive contact are thus met.

I claim:

1. Resin precursor composition containing in suspension a filler normally tending to settle over time, said composition comprising a liquid first resin precursor reactive with a separately prepared second resin precursor to form a resin, and suspended within said first resin precursor from 5 to 500 parts by weight of a particulate flier per 100 parts by weight of said first resin precursor, and a sufficient amount from 0.5 to 25 parts by weight of polyurethane or polyurea polymer suspension aid per 100 parts by weight of said first resin precursor intimately distributed through said composition against settling of said filler from suspension, said suspension aid within said composition having thixotropic response to flow under pressure to permit ready dispensing of said composition with said filler suspended therein.

2. The resin precursor composition according to claim 1, in which said polymer suspension aid is formed in situ in said resin precursor.

3. The resin precursor composition according to claim 1, in which said fiber is an inorganic filler.

4. The resin precursor composition according to claim 1, in which said polymer suspension aid is polyurethane polymer.

5. The resin precursor composition according to claim 1, in which said polymer suspension aid is polyurea polymer.

6. The resin precursor composition according to claim 1, in which said filler is silver and is present in at least one of said first or second resin precursors in an amount from 60 to 92 parts by weight of silver per 100 parts of said first or second resin precursors.

7. The resin precursor composition according to claim 1, in which said polymer suspension aid is a polyurethane polymer and is present in one both of said resin precursors in an amount from 1 to 10 parts by weight per 100 parts of said resin precursor.

8. The resin precursor composition according to claim 1, in which said polymer suspension aid is a polyurea polymer and is present in one or both of said resin precursors in an amount from 1 to 10 parts by weight per 100 parts of said resin precursor.

9. The resin precursor composition according to claim 1, in which said first and second resin precursors each comprise an epoxy resin precursor.

10. The resin precursor composition according to claim 1, in which said first and second resin precursors each comprise a urethane polymer precursor.

11. The resin precursor composition according to claim 1, in which said first and second resin precursors each comprise a phenol resin precursor.

12. The resin precursor composition according to claim 1, in which said first and second resin precursors each comprise a polyester precursor.

13. The resin precursor composition according to claim 1, in which said resin precursor comprises an acrylic or acrylate resin precursor.

14. The resin precursor composition according to claim 1, in which said resin precursor comprises a silicone resin precursor.

15. Urethane resin precursor composition containing a suspended particulate filler normally tending to settle from suspension over time, said composition comprising a liquid first urethane resin precursor reactive with a separately prepared second urethane resin precursor to form a urethane resin, said first urethane resin precursor containing from 5 to 500 parts by weight of said particulate filler per 100 parts by weight of said urethane resin precursor, and further containing a sufficient amount of polyurethane or polyurea polymer suspension aid separate from and within said resin precursor to stabilize the suspension of said filler in said composition against settling, said polymer suspension aid having thixotropic response to flow under pressure to permit ready dispensing of said composition while said filler is maintained suspended therein.

16. Urethane resin precursor composition according to claim 15, in which said first urethane resin precursor comprises an isocyanato reagent.

17. Urethane resin precursor composition according to claim 16, wherein said isocyanato reagent is a first isocyanato reagent, and in which said polymer suspension aid comprises a polyurethane polymer reaction product of a liquid, saturated, nonbranched, aliphatic diol having an even number of carbon atoms and terminal hydroxyl groups and a second isocyanato reagent, said diol reacting rapidly with said second isocyanato reagent to the exclusion substantially of diol reaction with said first isocyanato reagent, whereby said filler suspension stabilizing polyurethane polymer suspension aid is formed in situ within said first urethane resin precursor comprising said isocyanato reagent.

18. Urethane resin precursor composition according to claim 17, in which said polyurethane polymer suspension aid reaction product is reacted free of reaction of said resin precursor isocyanato reagent with said diol, said polyurethane polymer suspension aid being present in an amount from 0.5 to 25 parts by weight per 100 parts by weight of said first isocyanato reagent urethane resin precursor.

19. Urethane resin precursor composition according to claim 17, in which said polyurethane polymer suspension aid product reaction is substantially free of polymer chain terminating reactions.

20. Urethane resin precursor composition according to claim 17, in which said diol comprises ethylene glycol, 1,4-butane diol or 1,6-hexane diol.

21. Urethane resin precursor composition according to claim 17, in which said diol is added incrementally to said second polymer isocyanato reagent in the presence of said first isocyanato reagent to form said polyurethane polymer suspension aid in situ by preferential reaction with said second isocyanato reagent in the presence of said first isocyanato reagent and substantially free of reaction therewith.

22. Urethane resin precursor according to claim 17, in which said particulate filler comprises a metal or mineral material.

23. Urethane resin precursor according to claim 22, in which said particulate filler is a mineral material having a specific gravity above 1.0 which does not impart thixotropic properties to said resin precursor.

24. Urethane resin precursor according to claim 22, in which said particulate filler is an electrically conductive or superconductive metal or ceramic material.

25. Urethane resin precursor according to claim 24, in which said particulate filler comprises silver, copper, or aluminum metal.

26. Urethane resin precursor according to claim 25, in which said particulate filler is silver metal.

27. Urethane resin precursor according to claim 24, in which said particulate filler comprises ceramic material.

28. Urethane resin precursor composition containing a suspended particulate filler normally tending to settle from suspension over time, said composition comprising reactive with a liquid first urethane resin precursor a separately prepared second urethane resin precursor to form a urethane resin, said second urethane resin precursor containing from 5 to 500 parts by weight of said particulate filler per 100 parts by weight of said second urethane resin precursor, and further containing a sufficient mount of polyurethane or polyurea polymer suspension aid separate from and within said resin precursor to stabilize the suspension of said filler in said composition against settling, said polymer suspension aid having thixotropic response to flow under pressure to permit ready dispensing of said composition while said filler is maintained suspended therein.

29. Urethane resin precursor composition according to claim 28, in which said polymer suspension aid comprises a polyurea polymer.

30. Urethane resin precursor composition according to claim 29, in which said second urethane resin precursor comprises an active hydrogen containing reagent reactive with said first urethane resin precursor to form a resin comprised of repeating urethane linkages.

31. Urethane resin precursor composition according to claim 29, in which said active hydrogen containing reagent comprises a polyol reagent, said first urethane resin precursor comprises a first isocyanato reagent reactive with said polyol reagent to form a resin comprised of repeating urethane linkages.

32. Urethane resin precursor composition according to claim 31, in which said polyurea polymer suspension aid comprises the polyurea reaction product formed in situ in said second resin precursor of a polyurea-forming isocyanato reagent and an aromatic amine.

33. Urethane resin precursor composition according to claim 32, in which said aromatic amine is delayed not less than 10 seconds in its polyurea-forming reaction after mixing with said polyurea-forming isocyanato reagent.

34. Urethane resin composition containing a mixture of a suspended particulate filler normally tending to settle from suspension over time, a liquid first urethane resin precursor and separately maintained therefrom a liquid second urethane resin precursor reactive with said first urethane resin precursor to form a urethane resin, said first and second urethane resin precursors containing from 5 to 500 parts by weight of said particulate filler per 100 parts by weight of said urethane resin precursor, said first urethane resin precursor further containing a sufficient amount between 0.5 and 25 parts per 100 parts by weight of said first urethane resin precursor of polyurethane polymer suspension aid separately formed within said first urethane resin precursor to stabilize the suspension of said filler in said first urethane resin precursor against settling, said second urethane resin precursor further containing a sufficient amount between 0.5 and 25 parts per 100 parts by weight of said second urethane resin precursor of polyurea polymer suspension aid separately formed within said second urethane resin precursor to stabilize the suspension of said filler in said second urethane resin precursor against settling, each of said polymer suspension aids having thixotropic response to flow under pressure to permit ready dispensing of their said precursors while said filler is maintained suspended therein.

35. The urethane resin reaction product of said first and second urethane resin precursors of claim 34 reacted with each other.

36. Urethane resin composition according to claim 34, in which said suspension aid polymer in said first urethane resin precursor comprises a polyurethane polymer reaction product of a suspension aid polymer isocyanato reagent and a suspension aid polymer liquid, saturated, nonbranched, aliphatic diol having an even number of carbon atoms and terminal hydroxyl groups and a second isocyanato reagent, said reagents having a preferential reactivity with each other to form said suspension aid polymer rather than other resin products.

37. Urethane resin composition according to claim 34, in which said suspension aid polymer in said second urethane polymer comprises a polyurea polymer reaction product of a suspension aid polymer isocyanato reagent and a suspension aid polymer aromatic amine, said reagents having a preferential reactivity with each other to form said suspension aid polymer rather than other resin products.

38. Urethane resin composition according to claim 37, in which said suspension aid polymer in said first urethane resin precursor comprises a polyurethane polymer reaction product of a suspension aid polymer isocyanato reagent and a suspension aid polymer diol which is liquid, saturated, nonbranched and aliphatic, and has an even number of carbon atoms and terminal hydroxyl groups and a second isocyanato reagent, said reagents having a preferential reactivity with each other to form said suspension aid polymer rather than other resin products.

39. Urethane resin composition according to claim 38, in which said first urethane resin precursor comprises an isocyanato reagent and said second urethane resin precursor comprises an active hydrogen containing reagent reactive with said urethane resin precursor isocyanato reagent to form a resin comprised of repeating urethane linkages.

40. Urethane resin composition according to claim 39, in which said diol comprises ethylene glycol, 1,4-butane diol or 1,6-hexane diol.

41. Urethane resin composition according to claim 40, in which said particulate filler comprises a metal, carbon, or mineral material.

42. Urethane resin composition according to claim 41, in which said particulate filler is silver, copper, or aluminum metal.

43. Urethane resin composition according to claim 42, in which said particulate filler is silver metal.

44. Urethane resin composition according to claim 41, in which said particulate filler comprises ceramic material.

45. Method of stabilizing particulate filler against settling from suspension in a resin precursor while having thixotropic response in said precursor upon expression from a container, including maintaining a polyurethane or polyurea polymer in a small but effective amount in said precursors.

* * * * *